US012796300B2

(12) United States Patent
Seo et al.

(10) Patent No.: US 12,796,300 B2
(45) Date of Patent: Nov. 10, 2026

(54) DISPLAY DEVICE AND METHOD OF MANUFACTURING THE SAME

(71) Applicant: Samsung Display Co., LTD., Yongin-si (KR)

(72) Inventors: Kabjong Seo, Yongin-si (KR); Junho Sim, Yongin-si (KR); Jaehun Lee, Yongin-si (KR); Yang-Ho Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 548 days.

(21) Appl. No.: 18/196,173

(22) Filed: May 11, 2023

(65) Prior Publication Data

US 2024/0107863 A1 Mar. 28, 2024

(30) Foreign Application Priority Data

Sep. 23, 2022 (KR) ........................ 10-2022-0121037

(51) Int. Cl.
*H10K 59/80* (2023.01)
*H10K 59/12* (2023.01)

(52) U.S. Cl.
CPC ..... *H10K 59/8792* (2023.02); *H10K 59/1201* (2023.02); *H10K 59/873* (2023.02)

(58) Field of Classification Search
CPC ........... H10K 59/8792; H10K 59/1201; H10K 59/873; H10K 59/879; H10K 50/858; H10K 50/844; H10K 71/00
See application file for complete search history.

(56) References Cited

U.S. PATENT DOCUMENTS

| | | | | |
|---|---|---|---|---|
| 2021/0376000 | A1* | 12/2021 | Jin | H10K 59/38 |
| 2022/0085334 | A1 | 3/2022 | Oh et al. | |
| 2022/0140283 | A1 | 5/2022 | Kim et al. | |
| 2022/0238606 | A1 | 7/2022 | Jeong et al. | |

FOREIGN PATENT DOCUMENTS

| | | | |
|---|---|---|---|
| CN | 111477100 | A | 7/2020 |
| CN | 113281925 | A | 8/2021 |
| JP | 2007249052 | A | 9/2007 |
| KR | 101546554 | B1 | 8/2015 |
| KR | 20200083875 | A | 7/2020 |
| KR | 20220058720 | A | 5/2022 |
| KR | 20220109548 | A | 8/2022 |

* cited by examiner

*Primary Examiner* — Elmito Breval
(74) *Attorney, Agent, or Firm* — CANTOR COLBURN LLP

(57) ABSTRACT

A display device includes: a substrate including a light emitting area and non-light emitting area, a light emitting element including a light emitting layer disposed in the light emitting area on the substrate, an encapsulation layer disposed on the light emitting layer, a transparent layer defining a plurality of first openings and a plurality of second openings and disposed on the encapsulation layer, a plurality of light blocking pattern disposed on the encapsulation and filling each of the first openings, a first transparent pattern disposed on the encapsulation layer and filling each of the second openings and the second transparent pattern having a different refractive index from that of the first transparent pattern and disposed on the first transparent pattern.

10 Claims, 13 Drawing Sheets

DISPLAY DEVICE AND METHOD OF MANUFACTURING THE SAME

This application claims priority to Korean Patent Application No. 10-2022-0121037, filed on Sep. 23, 2022, and all the benefits accruing therefrom under 35 U.S.C. § 119, the content of which in its entirety is herein incorporated by reference.

BACKGROUND

1. Field

Embodiments relate to a display device and a method of manufacturing the display device. More particularly, embodiments relate to a display device that provides visual information and a method of manufacturing the display device.

2. Description of the Related Art

With the development of information technology, the importance of display device, which is a connection medium between a user and information, has been highlighted. Accordingly, the use of display devices such as a liquid crystal display device ("LCD"), an organic light emitting display device ("OLED"), a plasma display device ("PDP"), and the like is increasing.

Such a display device may display an image having a wide viewing angle, or the viewing angle of an image displayed on the display device may be limited to improve security or image reflection.

SUMMARY

Embodiments provide a display device with a limited viewing angle.

Embodiments provide a method of manufacturing the display device.

A display device according to an embodiment includes a substrate including a light emitting area and a non-light emitting area, a light emitting element disposed in the light emitting area on the substrate, an encapsulation layer disposed on the light emitting element, a transparent layer disposed on the encapsulation layer, where a plurality of first openings and a plurality of second openings are defined through the transparent layer, a plurality of light blocking patterns disposed on the encapsulation layer and filling the first openings, respectively, a first transparent pattern disposed on the encapsulation layer in each of the second openings, and a second transparent pattern disposed on the first transparent pattern, where the second transparent pattern has a refractive index different from a refractive index of the first transparent pattern.

In an embodiment, a recess may be defined on an upper surface of the first transparent pattern, and the second transparent pattern may fill the recess.

In an embodiment, an upper surface of the first transparent pattern may have a concave shape in a cross section.

In an embodiment, a refractive index of the transparent layer may be less than the refractive index of the first transparent pattern.

In an embodiment, the refractive index of the first transparent pattern may be greater than the refractive index of the second transparent pattern.

In an embodiment, each of the transparent layer, the first transparent pattern and the second transparent pattern may include an organic material.

In an embodiment, each of the light blocking patterns may include at least one selected from molybdenum-tantalum oxide and an organic material including a black pigment.

In an embodiment, the transparent layer and the second transparent pattern may include a same material as each other.

In an embodiment, angles between each of the light blocking patterns and the encapsulation layer may be acute angles or right angles.

In an embodiment, an angle between a boundary line where the transparent layer and the first transparent pattern are in contact with each other and the encapsulation layer may be an acute angle or a right angle.

In an embodiment, each of the light blocking patterns may not overlap the light emitting area, and may overlap the non-light emitting area.

In an embodiment, a portion of the light blocking patterns may not overlap the light emitting area, and another portion of the light blocking patterns may overlap the non-light emitting area.

In an embodiment, each of the light blocking patterns may extend along to a second direction, and the light blocking patterns may be spaced apart from each other along to a first direction crossing the second direction.

A method of manufacturing a display device according to an embodiment includes forming a light emitting element on a substrate including a light emitting area and a non-light emitting area, forming an encapsulation layer on the light emitting element, forming a preliminary transparent layer on the encapsulation layer, forming a plurality of first openings by removing a first part of the preliminary transparent layer, forming a plurality of light blocking patterns filling the first openings, forming a transparent layer through which a plurality of second openings is formed by removing a second part of the preliminary transparent layer, forming a first transparent pattern in each of the second openings, and forming a second transparent pattern on the first transparent pattern.

In an embodiment, the forming the first openings by removing the first part of the preliminary transparent layer may include forming a first hard mask on the preliminary transparent layer, patterning the first hard mask and forming the first openings by removing a portion of the preliminary transparent layer which is exposed through a patterned first hard mask.

In an embodiment, the forming the transparent layer through which the second openings are formed by removing the second part of the preliminary transparent layer may include forming a second hard mask on the preliminary transparent layer and the light blocking patterns, patterning the second hard mask and forming the second openings by removing a portion of the preliminary transparent layer which is exposed through a patterned second hard mask.

In an embodiment, the forming the first transparent pattern in each of the second openings may include forming a preliminary transparent pattern filling the second openings and disposed on the transparent layer, and forming the first transparent pattern having an upper surface in which a recess is formed by removing an upper portion of the preliminary transparent pattern.

In an embodiment, the forming the second transparent pattern on the first transparent pattern may include filling the second transparent pattern in the recess of the first transparent pattern.

In an embodiment, the transparent layer and the second transparent pattern may include a same material as each other.

In an embodiment, a refractive index of the transparent layer may be less than a refractive index of the first transparent pattern, and the refractive index of the first transparent pattern may be greater than a refractive index of the second transparent pattern.

A display device according to embodiments of the disclosure may include a transparent layer through which a plurality of first openings and a plurality of second openings are defined, a plurality of light blocking patterns which fills the first openings respectively, a first transparent pattern in each of the second openings, and a second transparent pattern disposed on the first transparent pattern. In such embodiments, a refractive index of the first transparent pattern may be different from a refractive index of the transparent layer, and the first transparent pattern may have a concave shape in a cross section. Accordingly, in such embodiments, widths of the adjacent light blocking patterns may be allowed to increase to increase a front transmittance of display device, while the increase rate of a viewing angle of the display device may be reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
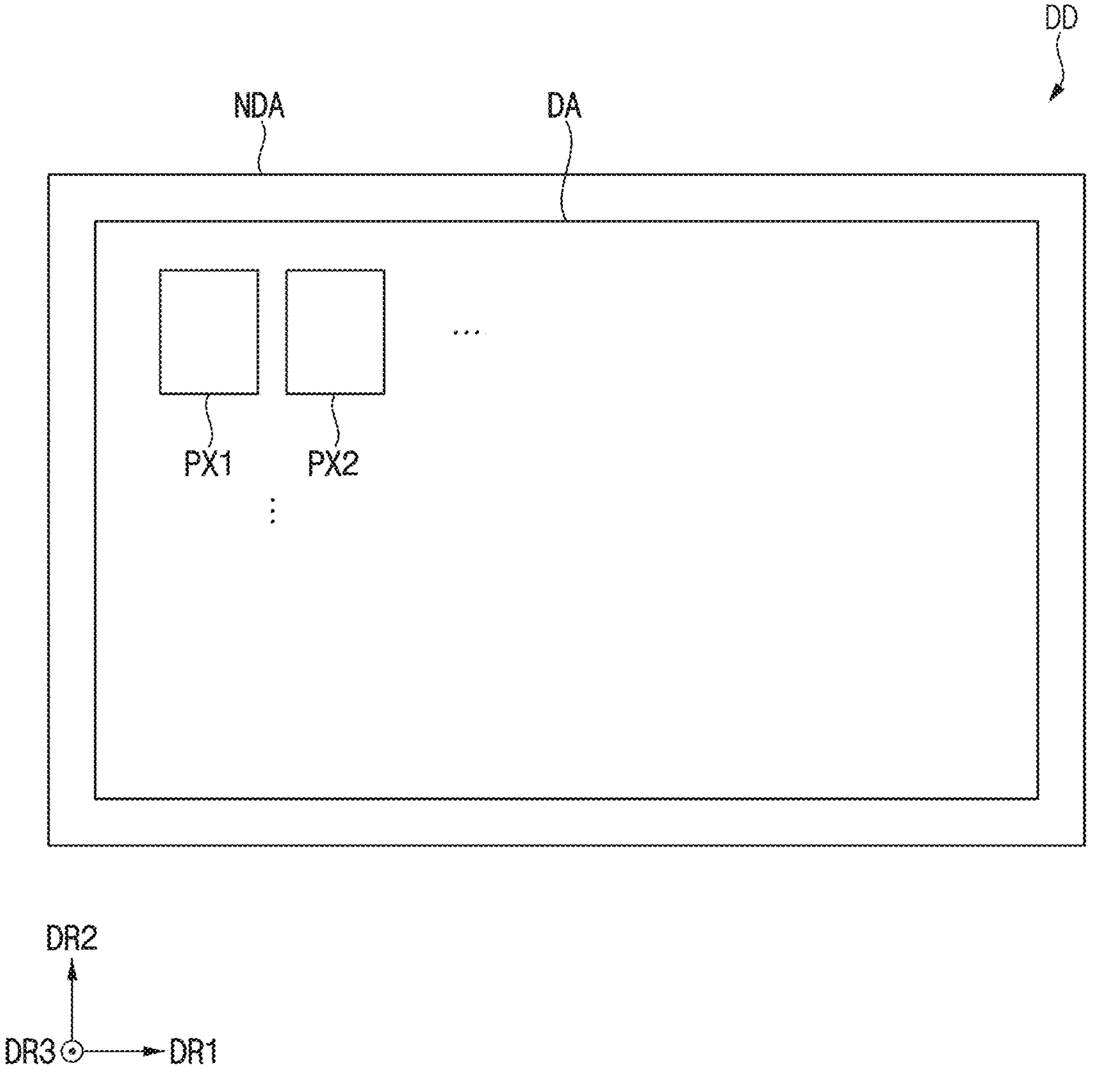
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, display devices in accordance with embodiments will be described in more detail with reference to the accompanying drawings. The same reference numerals are used for the same components in the drawings, and any repetitive detailed descriptions of the same components will be omitted.

FIG. 1 is a plan view illustrating a display device according to an embodiment.

Referring to FIG. 1, a display device DD according to an embodiment may include a display area DA and a non-display area NDA.

A plurality of pixels PX may be disposed in the display area DA. Each of the plurality of pixels PX may emit light. The plurality of pixels PX may include a first pixel PX1 and a second pixel PX2. In an embodiment, for example, the first pixel PX1 and the second pixel PX2 may emit light simultaneously. Alternatively, when the first pixel PX1 emits light, the second pixel PX2 may not emit light. Alternatively, when the first pixel PX1 does not emit light, the second pixel PX2 may emit light. As each of a plurality of pixels PX emits light, the display area DA may display an image.

The plurality of pixels PX may be repeatedly arranged along a first direction DR1 and a second direction DR2 crossing the first direction DR1 on a plane. In an embodiment, for example, the second pixel PX2 may be adjacent to the first pixel PX1. In such an embodiment, the second pixel PX2 may be adjacent to the first pixel PX1 in the second direction DR2.

The non-display area NDA may be disposed around the display area DA. In an embodiment, for example, the non-display area NDA may surround at least a part of the display area DA. A driving unit may be disposed in the non-display area NDA. The driving unit may provide signal or voltage to the plurality of pixels PX. In an embodiment, for example, the driving unit may include a data driving unit, a gate driving unit, and the like. The non-display area NDA may not display an image.

In an embodiment, a display surface of the display device DD may be on a plane defined by the first direction DR1 and the second direction DR2 crossing the first direction DR1, and, for example, the first direction DR1 may be perpendicular to the second direction DR2. In addition, a third direction DR3 may be perpendicular to the first direction DR1 and DR2, respectively. The third direction DR3 may be a thickness direction of the display device DD.

In an embodiment, the display device DD may be an organic light emitting display device ("OLED"), a liquid crystal display device ("LCD"), a field emission display device ("FED"), a plasma display device ("PDP"), an electrophoretic display device ("EPD") or an inorganic light emitting display device ("ILED"), for example.

Figure 2:
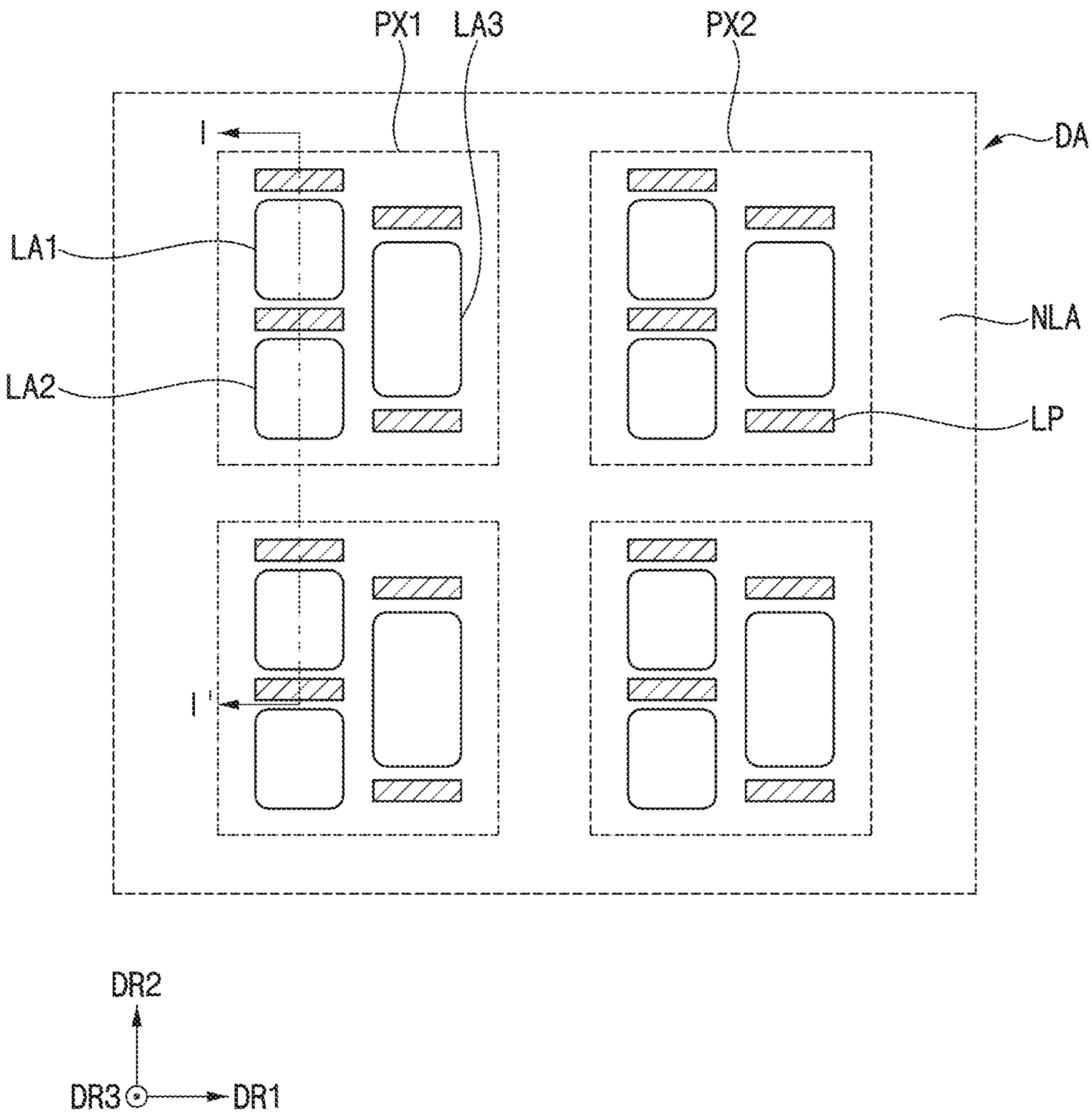
FIG. 2 is an enlarged plan view illustrating a portion of a display area of the display device of FIG. 1.

FIG. 2 is an enlarged plan view illustrating a portion of a display area of the display device of FIG. 1.

Referring to FIG. 1 and FIG. 2, as described above, the display device DD may include the display area DA and the non-display area NDA, and a plurality of pixels PX may be disposed in the display area DA. The plurality of pixels PX may include the first pixel PX1 and the second pixel PX2.

Each of the first pixel PX1 and the second pixel PX2 may include a first light emitting area LA1, a second light emitting area LA2, a third light emitting area LA3, and a non-light emitting area NLA.

The first light emitting area LA1 may emit light of a first color, the second light emitting area LA2 may emit light of a second color, and the third light emitting area LA3 may emit light of a third color. In an embodiment, the first color may be red, the second color may be green, and the third color may be blue. As the first color, the second color, and the third color are combined, each of the first pixel PX1 and the second pixel PX2 may emit light of various colors. The non-light emitting area NLA may not emit light.

In an embodiment, the display device DD may include a plurality of light blocking patterns LP. In an embodiment, for example, each of the plurality of light blocking patterns LP may overlap the non-light emitting area NLA. In such an embodiment, each of the plurality of light blocking patterns may not overlap the first light emitting area LA1, the second light emitting area LA2 and the third light emitting area LA3.

Figure 3:
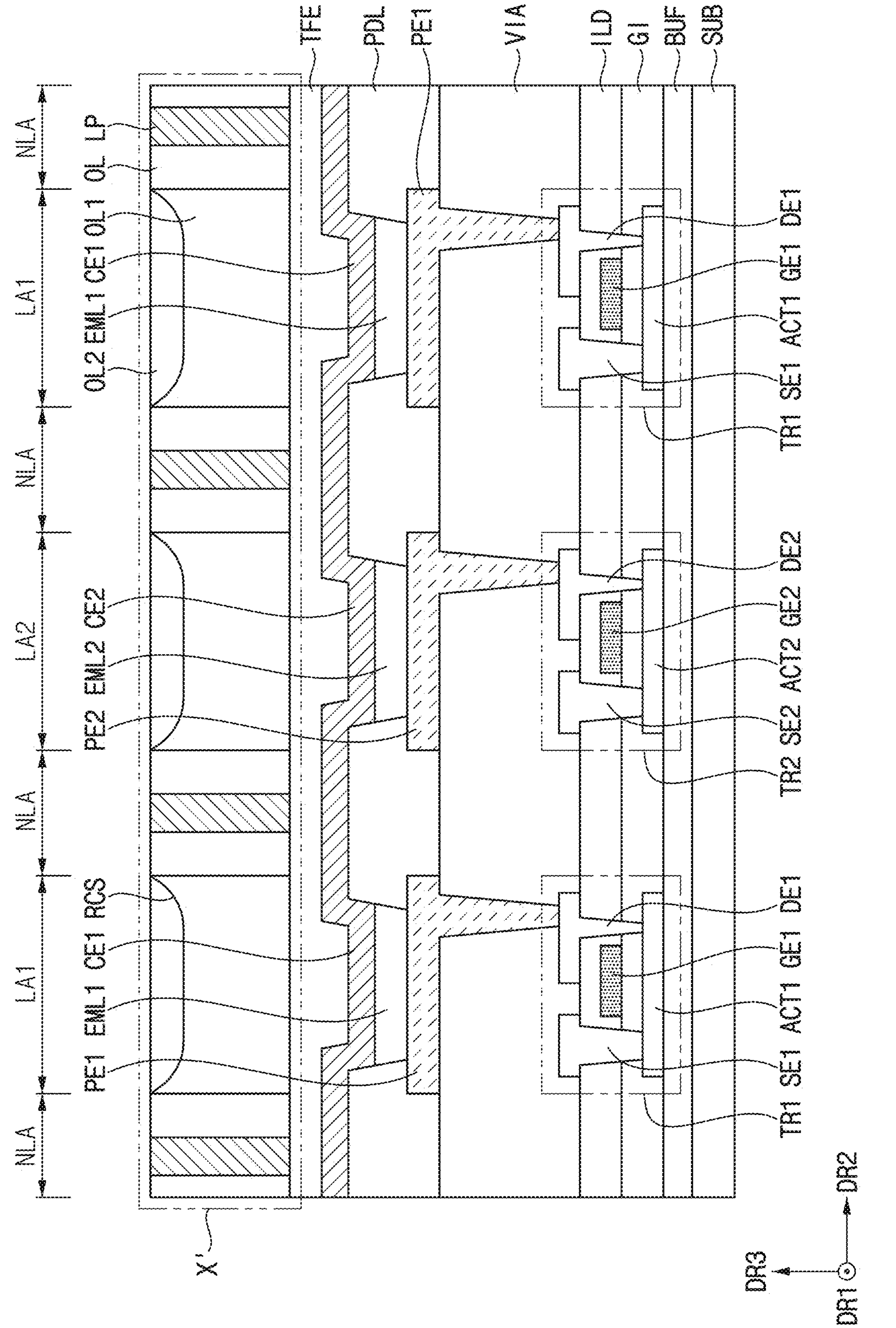
FIG. 3 is a cross-sectional view taken along line I-I' of FIG. 2.
Figure 4:
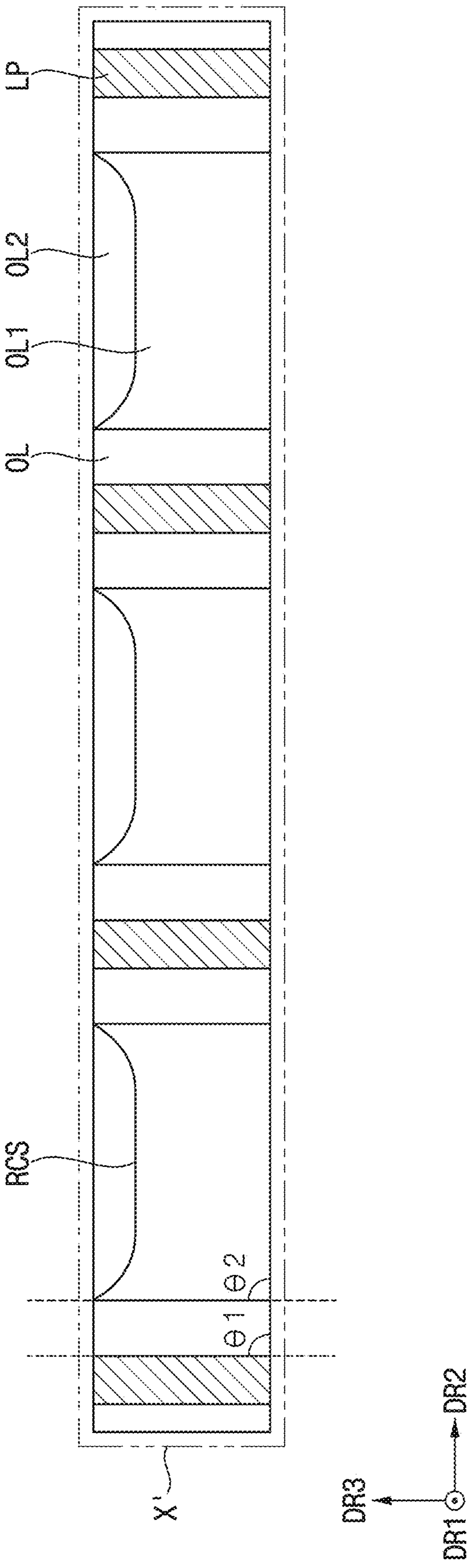
FIG. 4 is an enlarged cross-sectional view illustrating an area "X'" of FIG. 3.

FIG. 3 is a cross-sectional view taken along line I-I' of FIG. 2. FIG. 4 is an enlarged cross-sectional view illustrating an area "X'" of FIG. 3.

Referring to FIG. 3 and FIG. 4, the display device DD according to an embodiment may include a substrate SUB, a buffer layer BUF, a first transistor TR1, a second transistor TR2, a gate insulating layer GI, an interlayer insulating layer ILD, a via insulating layer VIA, a pixel defining layer PDL, a first pixel electrode PE1, a first light emitting layer EML1, a first common electrode CE1, a second pixel electrode PE2, a second light emitting layer EML2, a second common electrode CE2, an encapsulation layer TFE, the plurality of light blocking patterns LP, a transparent layer OL, a first transparent pattern OL1, and a second transparent layer OL2.

In such an embodiment, the first transistor TR1 may include (or be defined by) a first active pattern ACT1, a first gate electrode GE1, a first source electrode SE1, and a first drain electrode DE1. In addition, the second transistor TR2 may include a second active pattern ACT2, a second gate electrode GE2, a second source electrode SE2, and a second drain electrode DE2.

The substrate SUB may include a transparent material or an opaque material. The substrate SUB may include or be formed of a transparent resin substrate. In an embodiment, for example, the transparent resin substrate may include a polyimide substrate. In such an embodiment, the polyimide substrate may include a first organic layer, a first barrier layer, a second organic layer, or the like. alternatively, the substrate SUB may include a quartz substrate, a synthetic quartz substrate, a calcium fluoride substrate, a fluorine-doped quartz substrate, a sodalime substrate, a non-alkali glass substrate, or the like. They may be used alone or in combination with each other.

The buffer layer BUF may be disposed on the substrate SUB. The buffer layer BUF may prevent metal atoms or impurities from diffusing from the substrate SUB to the first and second transistors TR1 and TR2. In addition, the buffer layer BUF may improve the flatness of the surface of the substrate SUB when the surface of the substrate SUB is not uniform. In an embodiment, for example, the buffer layer BUF may include an inorganic material such as silicon oxide, silicon nitride, silicon oxynitride, or the like. They may be used alone or in combination with each other.

The first active pattern ACT1 and the second active pattern ACT2 may be disposed on the buffer layer BUF. Each of the first active pattern ACT1 and second active pattern ACT2 may include a metal oxide semiconductor, an inorganic semiconductor (e.g., amorphous silicon, polysilicon), or an organic semiconductor. Each of the first active pattern ACT1 and second active pattern ACT2 may include a source region, a drain region, and a channel region positioned between the source region and the drain region. The first active pattern ACT1 and second active pattern ACT2 may be formed through a same process and may include a same material as each other.

The metal oxide semiconductor may include a binary compound ($AB_x$), a ternary compound ($AB_xC_y$), a quaternary compound ($AB_xC_y$), and the like containing an indium (In), a zinc (Zn), a gallium (Ga), tin (Sn), titanium (Ti), aluminum (Al), hafnium (Hf), zirconium (Zr), magnesium (Mg", or the like. In an embodiment, for example, the metal oxide semiconductor may include zinc oxide ($ZnO_x$", gallium oxide ($GaO_x$), tin oxide ($SnO_x$), indium oxide ($InO_x$), indium gallium oxide ("IGO"), indium zinc oxide ("IZO"), indium tin oxide ("ITO"), indium zinc tin oxide ("IZTO"), indium gallium ("IGO"), or the like. They may be used alone or in combination with each other.

The gate insulating layer GI may be disposed on the buffer layer BUF. The gate insulating layer GI may sufficiently cover the first active pattern ACT1 and second active pattern ACT2 and may have a substantially flat upper surface with not generating a step around the first active pattern ACT1 and the second active pattern ACT2. Alternatively, the gate insulating layer GI may cover the first active pattern ACT1 and the second active pattern ACT2 and may be disposed along the profile of each of the first active pattern ACT1 and the second active pattern ACT2 with a uniform thickness. In an embodiment, for example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxynitride ($SiO_xC_y$), or the like. They may be used alone or in combination with each other.

The first gate electrode GE1 and the second gate electrode GE2 may be disposed on the gate insulating layer GI. The first gate electrode GE1 may overlap the channel region of the first active pattern ACT1, and the second gate electrode GE2 may overlap the channel region of the second active pattern ACT2.

Each of the first gate electrode GE1 and the second gate electrode GE2 may include a metal, an alloy metal nitride, a conductive metal oxide, a transparent conductive material, or the like. In an embodiment, for example, the metal may include silver (Ag), molybdenum (Mo), aluminum (Al), tungsten (W), copper (Cu), nickel (Ni), chromium (Cr), titanium (Ti), tantalum (Ta), platinum (Pt), or scandium (Sc). In an embodiment, for example, the conductive metal oxide may include ITO and IZO. In an embodiment, for example, the metal nitride may include aluminum nitride ($AlN_x$), tungsten nitride ($WN_x$), chromium nitride ($CrN_x$), or the like. They may be used alone or in combination with each other respectively.

The first gate electrode GE1 and the second gate electrode GE2 may be formed through a same process and may include a same material as each other.

The interlayer insulating layer ILD may be disposed on the gate insulating layer GI. The interlayer insulating layer ILD may sufficiently cover the first gate electrode GE1 and the second gate electrode GE2, and may have a substantially flat upper surface with not generating a step around the first gate electrode GE1 and the second gate electrode GE2. Alternatively, the interlayer insulating layer ILD may cover the first gate electrode GE1 and the second gate electrodes GE2, and may be disposed along a profile of each of the first gate electrode GE1 and the second gate electrode GE2 with a uniform thickness. In an embodiment, for example, the interlayer insulating layer ILD may include an inorganic material such as silicon oxide, silicon nitride, silicon carbide, silicon oxynitride, silicon oxynitride, or the like. They may be used alone or in combination with each other.

The first source electrode SE1 and the second source electrode SE2 may be disposed on the interlayer insulating layer ILD. The first source electrode SE1 may be connected to the source region of the first active pattern ACT1 through a contact hole defined in the gate insulating layer GI and the interlayer insulating layer ILD. The second source electrode SE2 may be connected to the source region of the second active pattern ACT2 through a contact hole defined in the gate insulating layer GI and the interlayer insulating layer ILD.

The first drain electrode DE1 and the second drain electrode DE2 may be disposed on the interlayer insulating layer ILD. The first drain electrode DE1 may be connected to the drain region of the first active pattern ACT1 through a contact hole defined in the gate insulating layer GI and the interlayer insulating layer ILD. The second drain electrode DE2 may be connected to the drain region of the second active pattern ACT2 through a contact hole defined in the gate insulating layer GI and the interlayer insulating layer ILD.

In an embodiment, for example, each of the first source electrode SE1 and the second source electrode SE2 may include a metal, an alloy, a metal nitride, a conductive metal oxide, a transparent conductive material, or the like. They may be used alone or in combination with each other. The first drain electrode DE1 and the second drain electrode DE2 may be formed through a same process as the first source electrode SE1 and the second source electrode SE2, and may include a same material as the first source electrode SE1 and the second source electrode SE2.

Accordingly, the first transistor TR1 including the first active pattern ACT1, the first gate electrode GE1, the first source electrode SE1, and the first drain electrode DE1 may be disposed on the substrate SUB, and the second transistor TR2 including the second active pattern ACT2, the second gate electrode GE2, the second source electrode SE2, and the second drain electrode DE2 may be disposed on the substrate SUB.

A via insulating layer VIA may be disposed on the interlayer insulating layer ILD. The via insulating layer VIA may sufficiently cover the first source electrode SE1, the second source electrodes SE2, the first drain electrode DE1 and the second drain electrode DE2. The via insulating layer VIA may include an organic material. In an embodiment, for example, the via insulating layer VIA may include organic materials such as phenolic resin, acrylic resin, polyimide resin, polyamide resin, siloxane resin, epoxy resin, or the like. They may be used alone or in combination with each other.

The first pixel electrode PE1 and the second pixel electrode PE2 may be disposed on the via insulating layer VIA. The first pixel electrode PE1 may overlap the first light emitting area LA1, and the second pixel electrode PE2 may overlap the second light emitting area LA2. The first pixel electrode PE1 may be connected to the first drain electrode DE1 through a contact hole defined in the via insulating layer VIA, and the second pixel electrode PE2 may be connected to the second drain electrode DE2 through a contact hole defined in the via insulating layer VIA.

In an embodiment, for example, each of the first pixel electrode PE1 and the second pixel electrode PE2 may include a metal, an alloy, a metal nitride, a conductive metal oxide, a transparent conductive material, or the like. They may be used alone or in combination with each other. In an embodiment, each of the first pixel electrode PE1 and the second pixel electrode PE2 may have a stacked structure including ITO/Ag/ITO. The first pixel electrode PE1 and the second pixel electrode PE2 may be formed through a same process and may include a same material as each other. In an embodiment, for example, each of the first pixel electrode PE1 and the second pixel electrode PE2 may operate as anodes.

The pixel defining layer PDL may be disposed on the via insulating layer VIA. The pixel defining layer PDL may overlap the non-light emitting area NLA. The pixel defining layer PDL may cover opposing side portions of each of the first pixel electrode PE1 and the second pixel electrode PE2. In addition, an opening exposing a part of the upper surface of each of the first pixel electrode PE1 and the second pixel electrode PE2 may be defined in the pixel defining layer PDL. In an embodiment, for example, the pixel defining layer PDL may include an inorganic material or an organic material. In an embodiment, the pixel defining layer PDL may include an organic material such as an epoxy resin, a siloxane resin, or the like. They may be used alone or in combination with each other. In an alternative embodiment, the pixel defining layer PDL may further include a light blocking material containing a black pigment, a black dye, or the like.

The first light emitting layer EML1 may be disposed on the first pixel electrode PE1, and the second light emitting layer EML2 may be disposed on the second pixel electrode PE2. Each of the first emitting layer EML1 and the second emitting layer EML2 may include an organic material that emits light of a predetermined color. In an embodiment, for example, the first emission layer EML1 may include an organic material that emits red light, and the second emission layer EML2 may include an organic material that emits green light.

The first common electrode CE1 may be disposed on the first light emitting layer EML1 and the pixel defining layer PDL, and the second common electrode CE2 may be disposed on the second light emitting layer EML2 and the pixel defining layer PDL. The first common electrode CE1 and the second common electrode CE2 may be integrally formed with each other as a single unitary and indivisible part. In an embodiment, for example, each of the first common electrode CE1 and the second common electrode CE2 may include a metal, an alloy, a metal nitride, a conductive metal oxide, a transparent conductive material, or the like. They may be used alone or in combination with each other. The first common electrode CE1 and the second common electrode CE2 may operate as cathodes.

In an embodiment, a first light emitting element may include (or be defined by) the first common electrode CE1, the first light emitting layer EML1, and the first pixel electrode PE1. In addition, a second light emitting element may include the second common electrode CE2, the second light emitting layer EML2, and the second pixel electrode PE2.

The encapsulation layer TFE may be disposed on the first common electrode CE1 and the second common electrode CE2. The encapsulation layer TFE may prevent impurities and moisture from penetrating into the first pixel electrode PE1, the first light emitting layer EML1, the first common electrode CE1, the second pixel electrode PE2, the second light emitting layer EML2, and the second common electrode CE2 from the outside. The encapsulation layer TFE may include at least one inorganic layer and at least one organic layer. In an embodiment, for example, the inorganic layer may include silicon oxide, silicon nitride, silicon oxynitride, or the like. They may be used alone or in combination with each other. The organic layer may include a polymeric cured product such as polyacrylate.

The transparent layer OL may be disposed on the encapsulation layer TFE. In an embodiment, a plurality of first openings (e.g., the first openings OP1 of FIG. 9) and a plurality of second openings (e.g., the second openings OP2 of FIG. 14) may be defined in the transparent layer OL. The first openings may be spaced apart from the second openings. In addition, each of the first and second openings may expose a portion of the upper surface of the encapsulation layer TFE. The transparent layer OL may have a substantially flat upper surface. The transparent layer OL may include an organic material. In an embodiment, for example, the transparent layer OL may include an organic material such as an epoxy resin, a siloxane resin, a polyimide resin, a photoresist, or the like. They may be used alone or in combination with each other.

The plurality of light blocking patterns LP may be disposed on the encapsulation layer TFE. In an embodiment, each of the plurality of light blocking patterns LP may be disposed to fill each of the first openings. Accordingly, the plurality of light blocking patterns LP may be spaced apart from each other. As described above, each of the plurality of light blocking patterns LP may overlap the non-light emitting area NLA. That is, each of the plurality of light blocking patterns LP may not overlap the light emitting areas LA1, LA2, and LA3.

Light emitted from the first light emitting layer EML1 and the second light emitting layer EML2 may be incident on the plurality of light blocking patterns LP or may pass among the plurality of light blocking patterns LP. Light incident on the plurality of light blocking patterns LP may be reflected from the plurality of light blocking patterns LP, may pass through the plurality of light blocking patterns LP, or may be absorbed by the plurality of light blocking patterns LP. In an embodiment, most of the light incident on the plurality of light blocking patterns LP may be absorbed by the plurality of light blocking patterns LP. Accordingly, the plurality of light blocking patterns LP may control a viewing angle of the display device DD.

Each of the plurality of light blocking patterns LP may include an inorganic material. In an embodiment, each of the plurality of the light blocking patterns LP may include an inorganic material such as molybdenum-tantalum oxide ("MTO"). Each of the plurality of light blocking patterns LP may have a multilayer structure. In an embodiment, for example, each of the plurality of light blocking patterns LP may have an MTO single-layer structure. Alternatively, the plurality of the light blocking patterns LP may have a double-layer structure including MTO/Mo, MTO/Cu, MTO/Al, and the like. Optionally, each of the plurality of light blocking patterns LP may have a triple-layer structure including MTO/Mo/MTO, MTO/Cu/MTO, MTO/Al/MTO, or the like. They may be used alone or in combination with each other. However, each of the plurality of light blocking patterns LP is not limited to including MTO. In an embodiment, for example, the plurality of light blocking patterns LP may include various materials having a relatively low transmittance and reflectance and a relatively high absorption rate.

Each of the plurality of light blocking patterns LP may include an organic material. In an alternative embodiment, each of the plurality of light blocking patterns LP may include an organic material including a black pigment.

In an embodiment, an angle $\theta_1$ formed by each of the plurality of light blocking patterns LP with the encapsulation layer TFE may be a right angle. In an alternative embodiment, the angle $\theta_1$ formed by each of the plurality of the light blocking patterns LP and the encapsulation layer TFE may be an acute angle (see FIG. 4).

The first transparent pattern OL1 may be disposed on the encapsulation layer TFE. In an embodiment, the first transparent pattern OL1 may be disposed to fill each of the second openings. The first transparent pattern OL1 may include an organic material. In an embodiment, for example, the first transparent pattern OL1 may include an organic material such as an epoxy resin, a siloxane resin, a polyimide resin, a photoresist, or the like. They may be used alone or in combination with each other.

In an embodiment, a recess RCS may be defined on an upper surface of the first transparent pattern OL1. In an embodiment, for example, due to the recess RCS defined on the first transparent pattern OL1, the first transparent pattern OL1 may have a concave shape on a cross section.

The second transparent pattern OL2 may be disposed on the first transparent pattern OL1. In an embodiment, the second transparent pattern OL2 may fill the recess RCS of the first transparent pattern OL1. The second transparent pattern OL2 may include an organic material. In an embodiment, for example, the second transparent pattern OL2 may include an organic material such as an epoxy resin, a siloxane resin, a polyimide resin, a photoresist, or the like. They may be used alone or in combination with each other.

Since each of the transparent layer OL, the first transparent pattern OL1, and the second transparent pattern OL2 is transparent, light emitted from the first emitting layer EML1 and the second emitting layer EML2 may pass through the transparent layer OL, the first transparent pattern OL1, and the second transparent pattern OL2.

The upper surface of the second transparent pattern OL2 may be positioned at a same level (or height) as the upper surface of the transparent layer OL on the substrate SUB. Alternatively, the upper surface of the second transparent pattern OL2 may be positioned at a higher level than the upper surface of the transparent layer OL on the substrate SUB. In such an embodiment, the second transparent pattern OL2 may be disposed on the transparent layer OL and the first transparent pattern OL1.

In the visible light region, a refractive index of the transparent layer OL may be different from a refractive index of the first transparent pattern OL1. In an embodiment, the refractive index of the transparent layer OL in the visible light region may be less than the refractive index of the first transparent pattern OL1.

The refractive index of the first transparent pattern OL1 in the visible light region may be different from a refractive index of the second transparent pattern OL2. In an embodiment, the refractive index of the first transparent pattern OL1 in the visible light region may be greater than the refractive index of the second transparent pattern OL2.

In a display device DD, the interval among a plurality of the adjacent light blocking patterns LP may be increased to increase the front transmittance of the display device DD. However, when the distance among a plurality of the adjacent light blocking patterns LP increases, the viewing angle of the display device DD may also increase.

According to an embodiment, even in a case where the distance among a plurality of the adjacent light blocking patterns LP increases to increase a front transmittance, the increase rate of the viewing angle of the display device DD with respect to light emitted from the first light emitting layer EML1 and the second light emitting layer EML2 may be relatively reduced due to the difference in refractive index between the transparent layer OL and the first transparent pattern OL1 and between the first transparent pattern OL1 and the second transparent pattern OL2.

In an embodiment, the transparent layer OL and the second transparent pattern OL2 may include a same organic material as each other. In an alternative embodiment, the transparent layer OL and the second transparent pattern OL2 may include different organic materials from each other.

In an embodiment, an angle $\theta_2$ formed by the boundary line between the transparent layer OL and the first transparent pattern OL1 with the encapsulation layer TEF may be a right angle. In an alternative embodiment, the angle $\theta_2$ formed by the boundary line between the transparent layer OL and the first transparent pattern OL1 with the encapsulation layer TEF may be an acute angle (see FIG. 4).

Figure 5A:
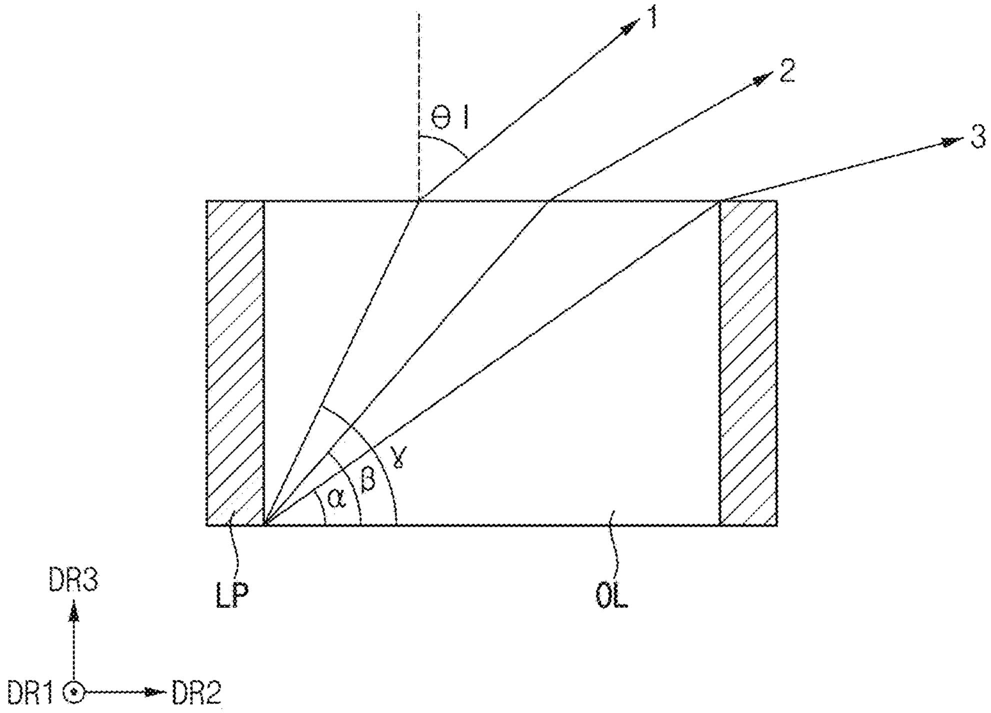
FIGS. 5A and 5B are cross-sectional views for explaining a propagation path of light incident on the side of a light transmitting layer according to an comparative example and an embodiment.
Figure 5B:
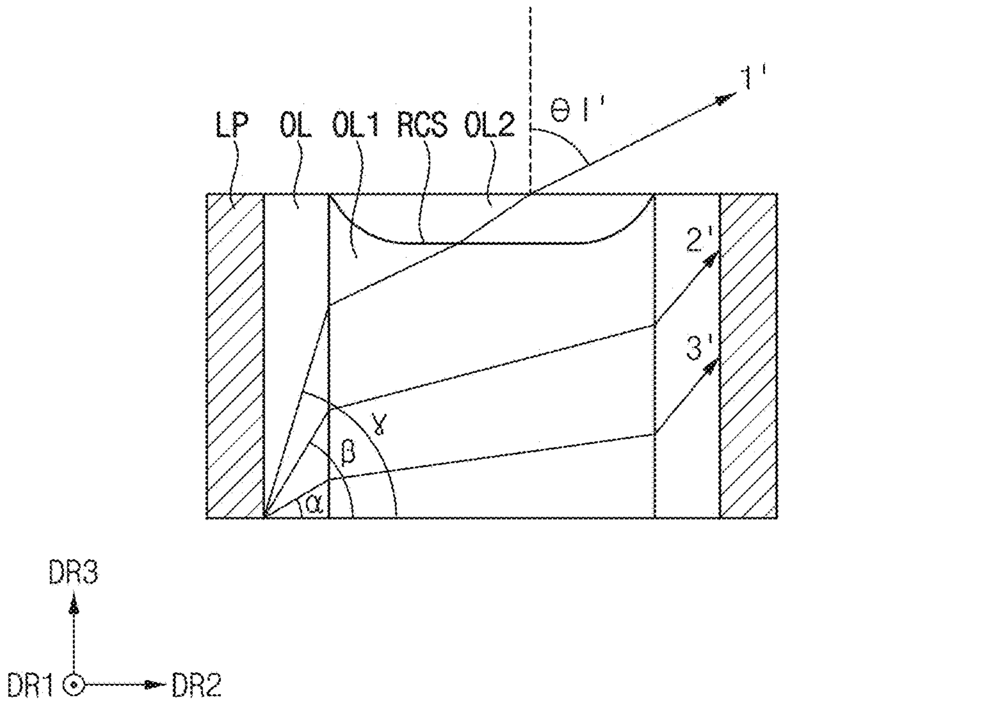
Figure 6A:
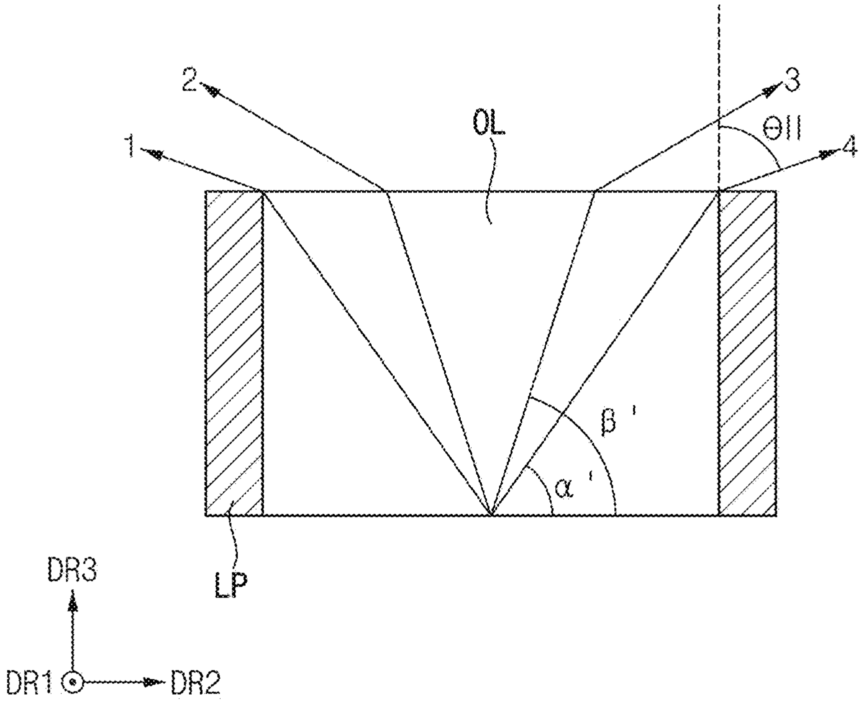
FIGS. 6A and 6B are cross-sectional views for explaining a propagation path of light incident on the middle of the light transmitting layer according to an comparative example and an embodiment.
Figure 6B:
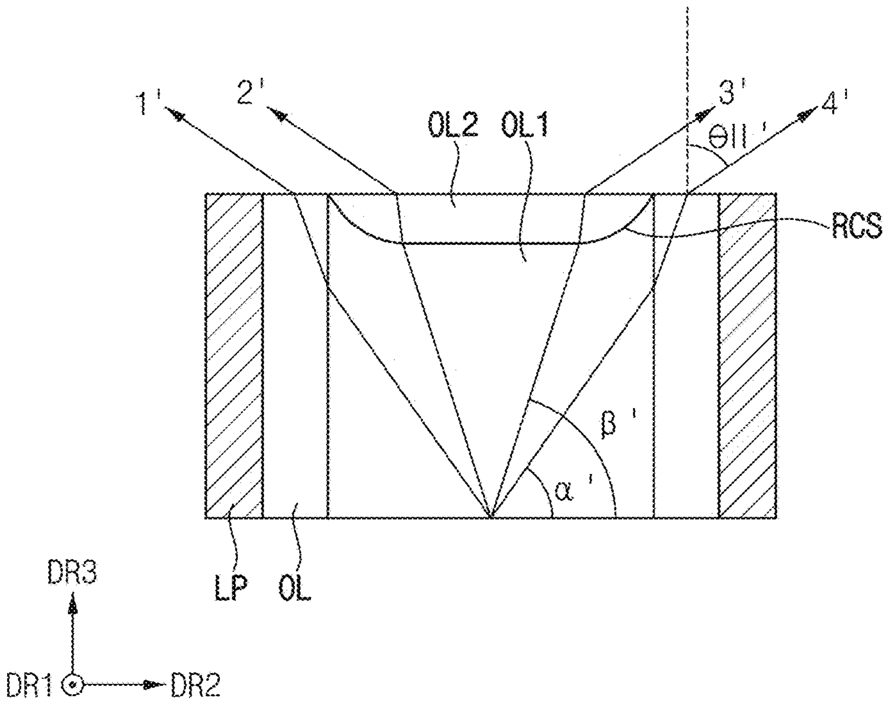

FIGS. 5A and 5B are cross-sectional views for explaining a propagation path of light incident on the side of a light transmitting layer according to a comparative example and an embodiment. FIGS. 6A and 6B are cross-sectional views for explaining a propagation path of light incident on the middle of the light transmitting layer according to a comparative example and an embodiment.

Referring to FIGS. 5A to 6B, FIG. 5A and FIG. 6A show a comparative example where only the transparent layer OL is defined, and FIGS. 5B and 6B show an embodiment where the transparent layer OL, the first transparent pattern OL1, and the second transparent pattern OL2 are defined. Hereinafter, the incident light emitted from the first light emitting layer (e.g., the first light emitting layer EML1 of FIG. 3) and the second light emitting layer (e.g., the second light emitting layer EML2 of FIG. 3) to the inside of the light transmitting layer will be illustrated as an example.

FIGS. 5A, 5B, 6A and 6B show a case where it is assumed that light has a property of being refracted toward a medium having a larger refractive index when light passes through other media which has a different refractive index.

FIGS. 5A and 5B illustrate a traveling path of light incident on a side surface of the light transmitting layer according to a comparative example and an embodiment. For example, light incident on the side surface of the light transmitting layer in FIG. 5A may include first incident light 1, second incident light 2, and third incident light 3, and light incident on the side surface of the light transmitting layer in FIG. 5B may include first incident light 1', second incident light 2', and third incident light 3'.

[FIG. 5A illustrates a traveling path of light incident on the side surface of the light transmitting layer according to a comparative example, and FIG. 5B illustrates a traveling path of light incident on the side surface of the light transmitting layer in a structure according to an embodiment of the disclosure.

An angle α formed by the first incident light 1 passing through the interior of the light transmitting layer with the encapsulation layer (e.g., the encapsulation layer TFE of FIG. 3) in FIG. 5A may be the same as an angle α formed by the first incident light 1 passing through the interior of the light transmitting layer with the encapsulation layer in FIG. 5B.

In addition, an angle β formed by the second incident light 2 passing through the interior of the light transmitting layer with the encapsulation layer in FIG. 5A may be the same as an angle β formed by the second incident light 2 passing through the interior of the light transmitting layer with the encapsulation layer in FIG. 5B.

In addition, an angle γ formed by the third incident light 3 passing through the interior of the light transmitting layer with the encapsulation layer in FIG. 5A may be the same as an angle γ formed by the third incident light 3 passing through the interior of the light transmitting layer with the encapsulation layer in FIG. 5B.

An viewing angle θ1 formed by the first incident light 1 which is refracted by the difference in the refractive index between the transparent layer OL and an air layer with an imaginary normal perpendicular to the upper surface of the transparent layer OL in FIG. 5A may be greater than an viewing angle $\theta_1$' formed by the first incident light 1', which is refracted multiple times by the difference in the refractive index between the transparent layer OL and the first transparent pattern OL1, the difference in refractive index between the first transparent pattern OL1 and the second transparent pattern OL2, and the difference in the refractive index between the second transparent layer OL2 and the air layer, with the imaginary normal perpendicular to the upper surface of the second transparent pattern OL2 in FIG. 5B.

On the other hand, as shown in FIG. 5B, the second incident light 2 and the third incident light 3 which are refracted multiple times by the difference in the refractive index between the transparent layer OL and the first transparent pattern OL1 may be absorbed by the light blocking pattern LP.

Accordingly, it may be confirmed that the viewing angle of the display device DD according to an embodiment regarding light incident on the side surface of the light transmitting layer is less than that of a display device according to a comparative example regarding light incident on the side surface of the light transmitting layer.

FIGS. 6A and 6B are cross-sectional views illustrating a traveling path of light incident on the center of the light transmitting layer according to a comparative example and an embodiment. For example, light incident on the center of the light transmitting layer in FIG. 6A may include first incident light 1, second incident light 2, third incident light 3, and fourth incident light 4, and light incident on the center of the light transmitting layer in FIG. 6B may include first incident light 1', second incident light 2', third incident light 3', and fourth incident light 4'.

In FIG. 6A, the first incident light 1 and the second incident light 2 may be symmetric to the third incident light 3 and the fourth incident light 4 respectively with respect to the middle of the light transmitting layer.

In FIG. 6B, the first incident light and the second incident light 2' may be symmetric to the third incident light 3' and the fourth incident light 4' respectively with respect to the middle of the light transmitting layer.

FIG. 6A may illustrate a progress path of light incident on the middle of the light transmitting layer in a comparative example, and FIG. 6B may illustrate a progress path of light incident on the middle of the light transmitting layer in an embodiment.

An angle α formed by the fourth incident light 4 passing through the interior of the light transmitting layer with the encapsulation layer (e.g., the encapsulation layer TFE of FIG. 3) in FIG. 6A may be the same as an angle α' formed by the fourth incident light 4' passing through the interior of the light transmitting layer with the encapsulation layer in FIG. 6B.

An viewing angle $\theta_{11}$ formed by the fourth incident light 4, which is refracted by the difference in the refractive index between the transparent layer OL and an air layer, with an imaginary normal perpendicular to the upper surface of the transparent layer OL in FIG. 6A may be greater than an viewing angle $\theta_{11}$' formed by the fourth incident light 4', which is refracted multiple times by the difference in the refractive index between the transparent layer OL and the first transparent pattern OL1, the difference in refractive index between the first transparent pattern OL1 and the air layer, with an imaginary normal perpendicular to the upper surface of the second transparent pattern OL2 in FIG. 6B.

Accordingly, it may be confirmed that the viewing angle of the display device DD according to an embodiment regarding light incident on the middle of the light transmitting layer is less than that of a display device according to the comparative example regarding light incident on the middle of the light transmitting layer.

FIGS. 7 to 17 are cross-sectional views illustrating an embodiment of a method of manufacturing the display device of FIG. 3.

Figure 7:
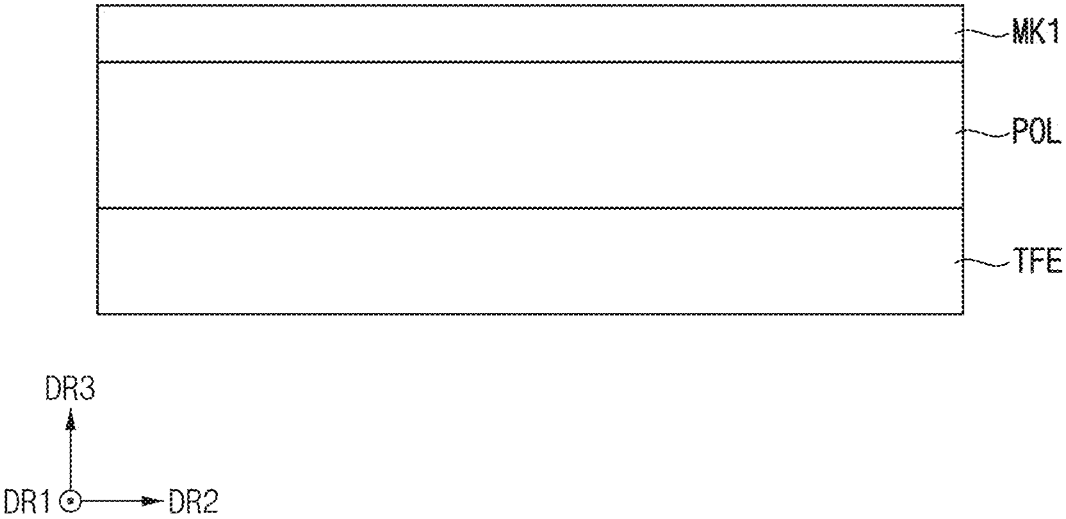
FIGS. 7 to 17 are cross-sectional views illustrating an embodiment of a method of manufacturing the display device of FIG. 3.

Referring to FIG. 3 and FIG. 7, the buffer layer BUF, the first active pattern and the second active pattern ACT1, ACT2, the gate insulating layer GE, the first gate electrode and the second gate electrode GE1, GE2, the interlayer insulating layer ILD, the first source electrode and the second source electrode SE1, SE2, the first drain electrode and the second drain electrode DE1, DE2, the via insulating layer VIA, the first pixel electrode and the second pixel electrode PE1, PE2, the pixel defining layer PDL, the first light emitting layer and the second light emitting layer EML1, EML2, the first common electrode and the second common electrode CE1, CE2 and the encapsulation layer may be sequentially formed on the substrate SUB.

A preliminary transparent layer POL may be formed on the encapsulation layer TFE. In an embodiment, for example, the preliminary transparent layer POL may be formed using an organic material. In an embodiment, the preliminary transparent layer POL may be formed using a photosensitive organic material.

A first hard mask (or a mask layer) MK1 may be formed on the preliminary transparent layer POL. In an embodiment, for example, the first hard mask MK1 may be formed using a metallic material.

Figure 8:
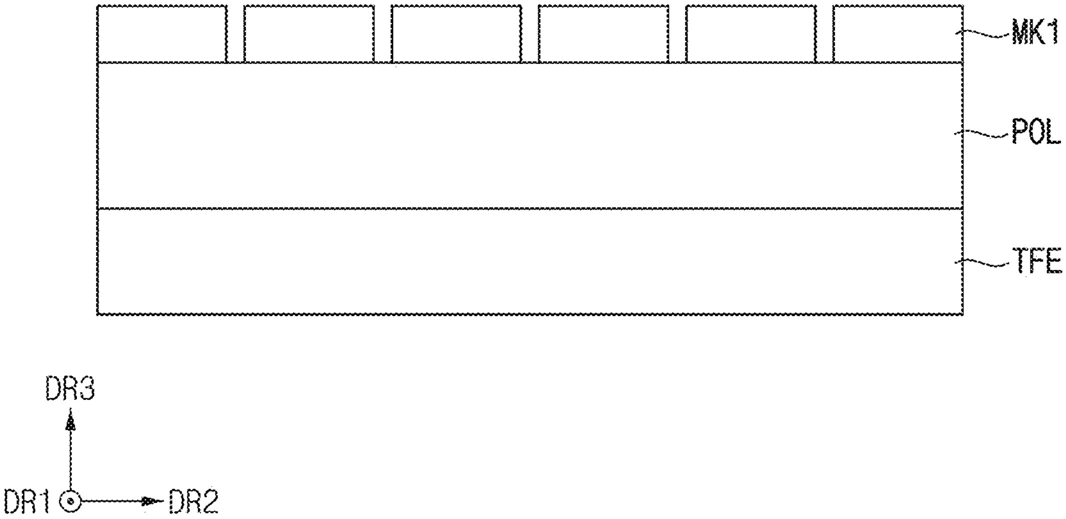

Referring to FIG. 7 and FIG. 8, a first hard mask MK1 may be patterned on the preliminary transparent layer POL.

Figure 9:
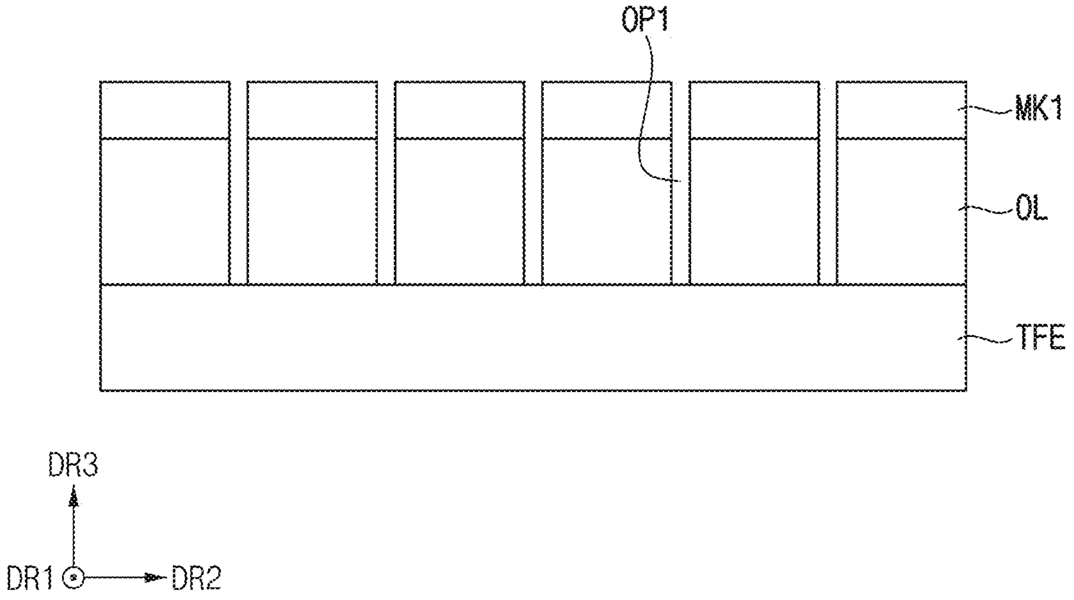

Referring to FIG. 9, the first openings OP1 may be formed by removing a portion of the exposed preliminary transparent layer POL that does not overlap the patterned first hard mask MK1. In an embodiment, the exposed portion of the preliminary transparent layer POL may be removed through an etching process. After the first openings OP1 are formed, the first hard mask MK1 may be removed.

Figure 10:
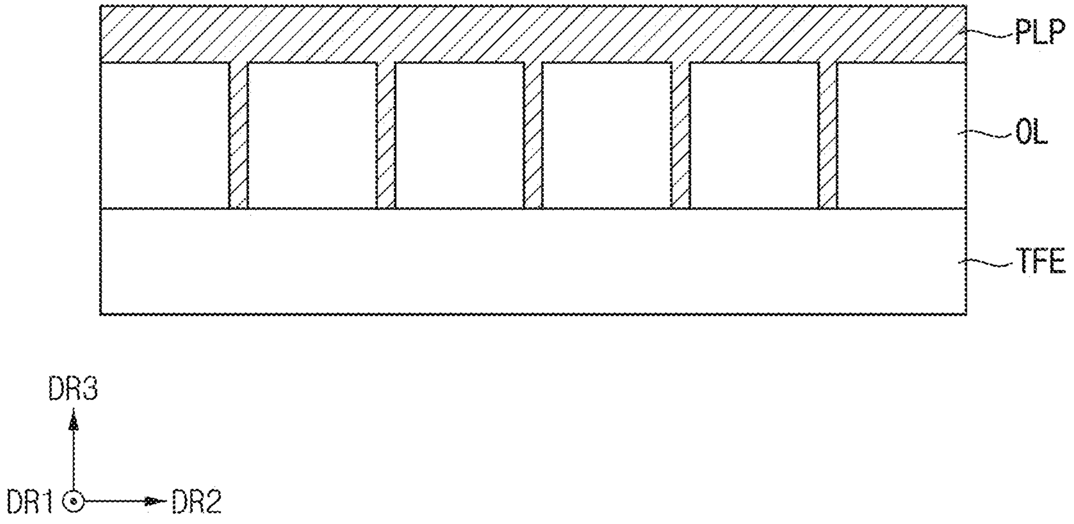

Referring to FIG. 10, a preliminary light blocking pattern PLP filling the first openings OP1 may be formed on the transparent layer OL. In an embodiment, for example, the preliminary light blocking pattern PLP may be formed using an inorganic material or an organic material.

Figure 11:
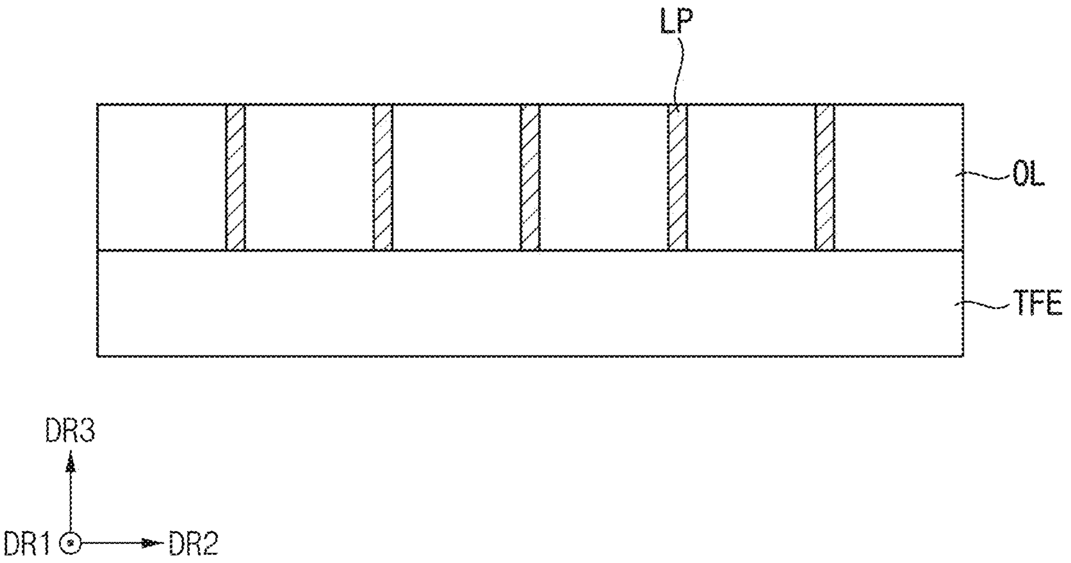

Referring to FIG. 11, a portion of the preliminary light blocking pattern PLP that does not fill the first openings OP1 may be removed. That is, a portion of the upper part of the preliminary light blocking pattern PLP may be removed. In an embodiment, for example, a portion of the upper part of the preliminary light blocking pattern PLP may be removed through a developer. Accordingly, the plurality of light blocking patterns LP filling the first openings OP1 may be formed.

Figure 12:
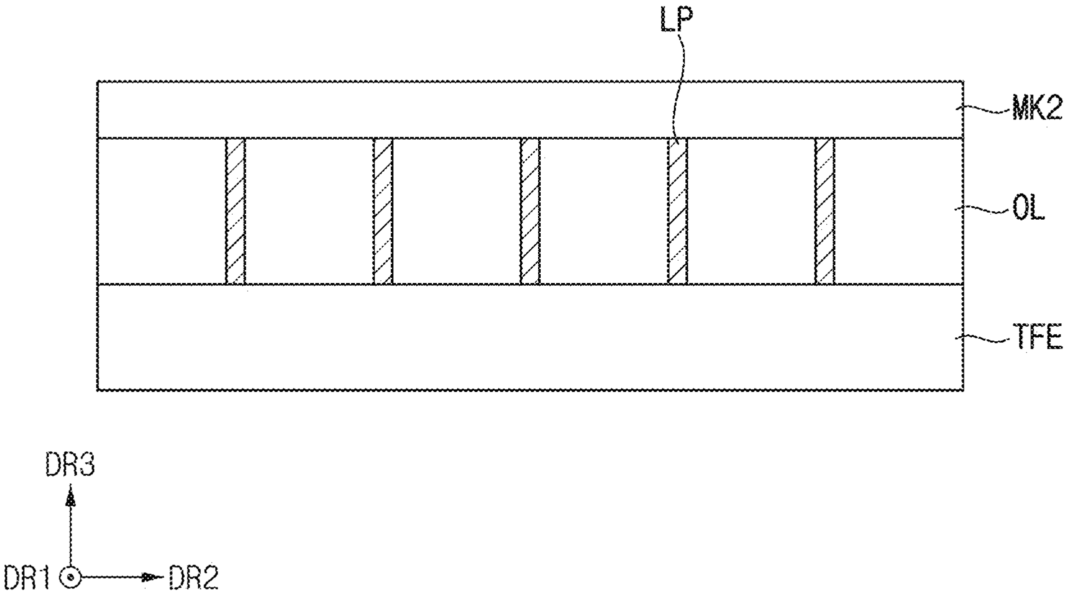

Referring to FIG. 12, a second hard mask MK2 may be formed on the transparent layer OL and the plurality of light blocking patterns LP. In an embodiment, for example, the second hard mask MK2 may include a metallic material.

Figure 13:
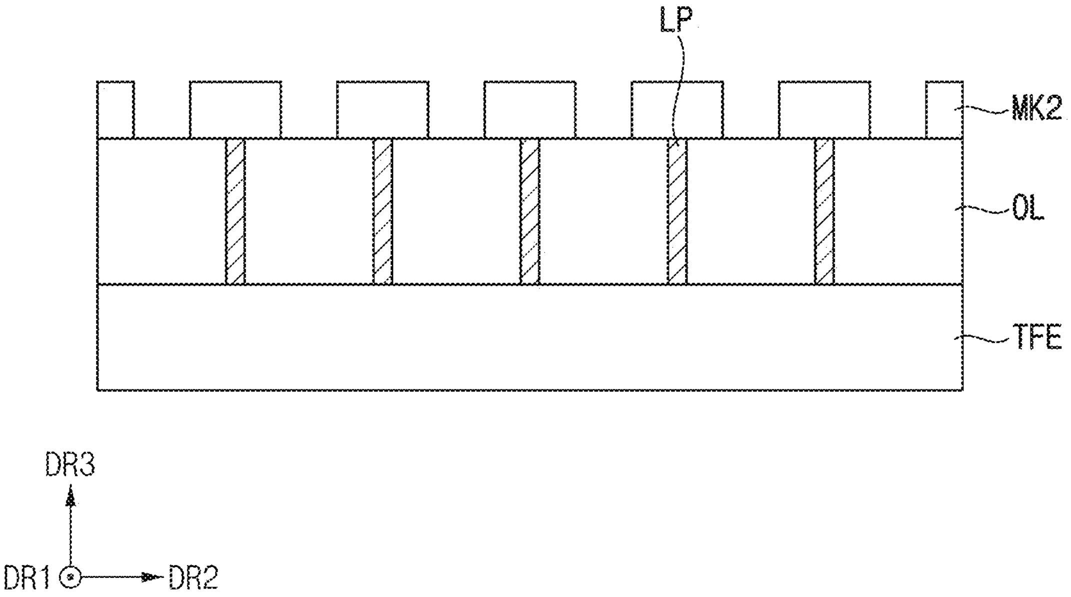

Referring to FIG. 13, the second hard mask MK2 may be patterned on the transparent layer OL and the plurality of light blocking patterns LP.

Figure 14:
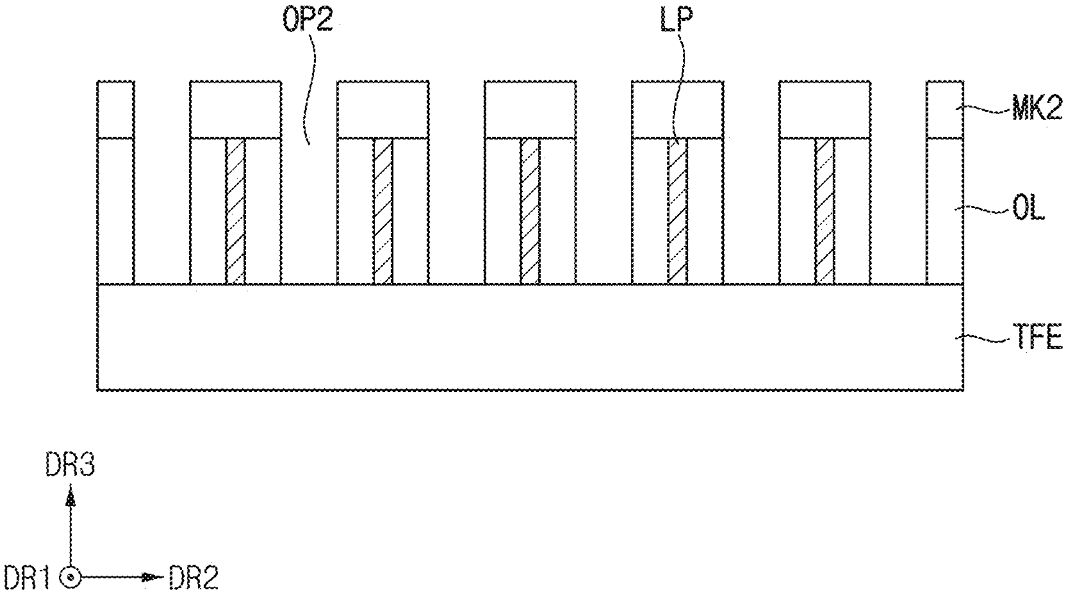

Referring to FIG. 14, the second openings OP2 can be formed by removing a portion of the transparent layer OL which is exposed and do not overlap the patterned second hard mask MK2. In an embodiment, a portion of the transparent layer OL which is exposed may be removed through an etching process. After the second openings OP2 are formed, the second hard mask MK2 may be removed.

Figure 15:
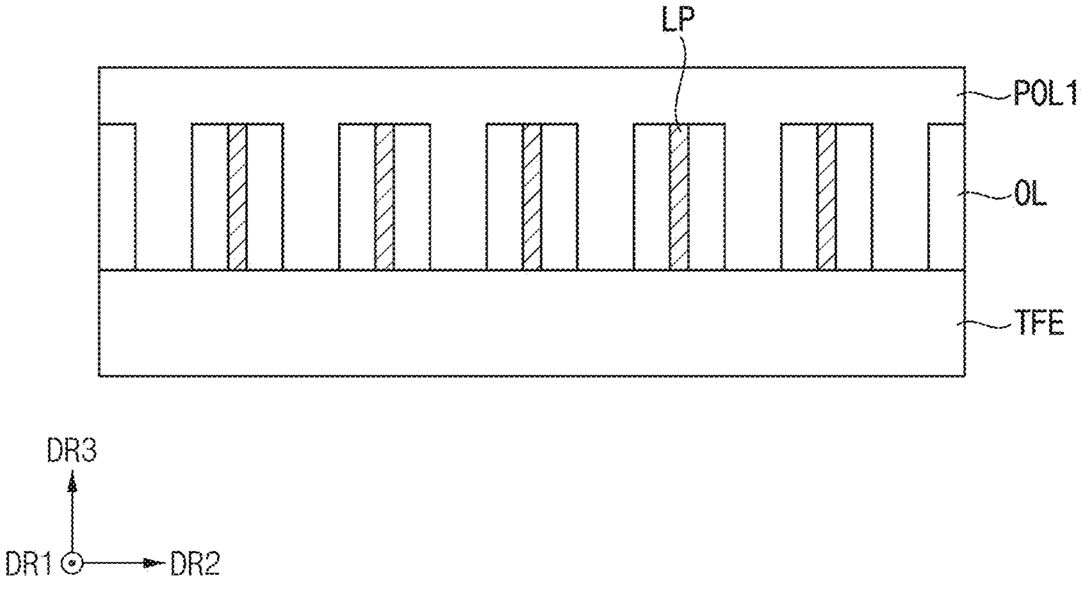

Referring to FIG. 15, a preliminary transparent pattern POL1 filling the second openings OP2 may be formed on the plurality of light blocking patterns LP and the transparent layer OL. In an embodiment, the preliminary transparent pattern POL1 may be formed using an organic material. In an embodiment, for example, the preliminary transparent pattern POL1 may include an organic material such as an epoxy resin, a siloxane resin, a polyimide resin, a photoresist, or the like.

Figure 16:
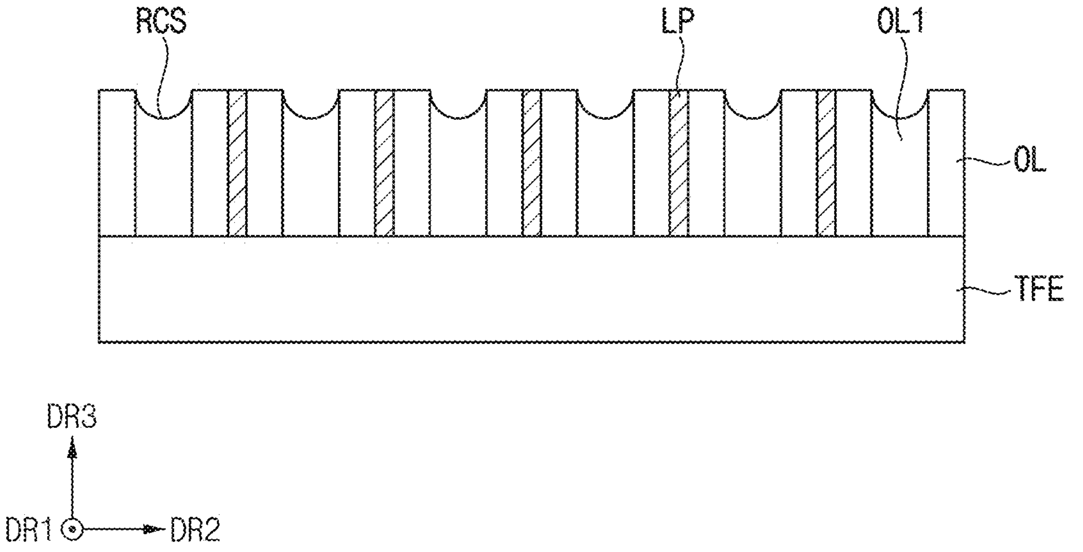

Referring to FIG. 16, a portion of an upper part of the first transparent pattern OL1 may be removed. In an embodiment, for example, a portion of the upper part of the first transparent pattern OL1 may be removed through a developer. Accordingly, a first transparent pattern OL1 filling the second openings OP2 and having a recess RCS formed on an upper surface thereof may be formed. That is, by removing a portion of the upper part of the first transparent pattern OL1, the first transparent pattern OL1 having a concave shape may be formed on a cross section.

Figure 17:
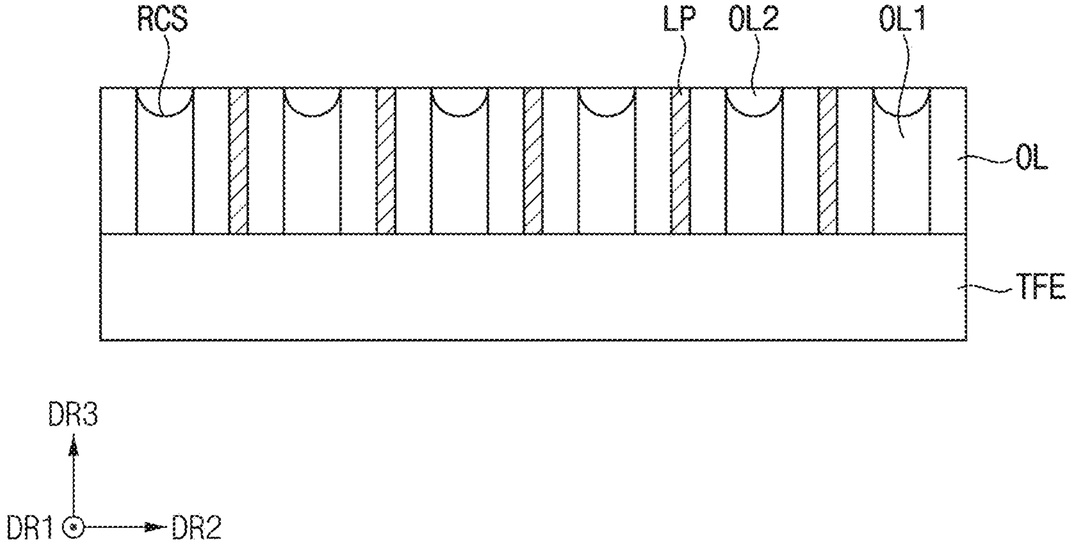

Referring to FIG. 17, the second transparent pattern OL2 may be formed on the first transparent pattern OL1. In an embodiment, the second transparent pattern OL2 may be formed using an organic material. In an embodiment, for example, the second transparent pattern OL2 may include an organic material such as an epoxy resin, a siloxane resin, a polyimide resin, a photoresist, or the like. Specifically, the second transparent pattern OL2 may fill the recess RCS of the first transparent pattern OL1. In an embodiment, the refractive index of the transparent layer OL may be less than the refractive index of the first transparent pattern OL1, and the refractive index of the first transparent pattern OL1 may be greater than that of the second transparent pattern OL2.

Accordingly, the display device DD illustrated in FIG. 3 may be manufactured.

Figure 18:
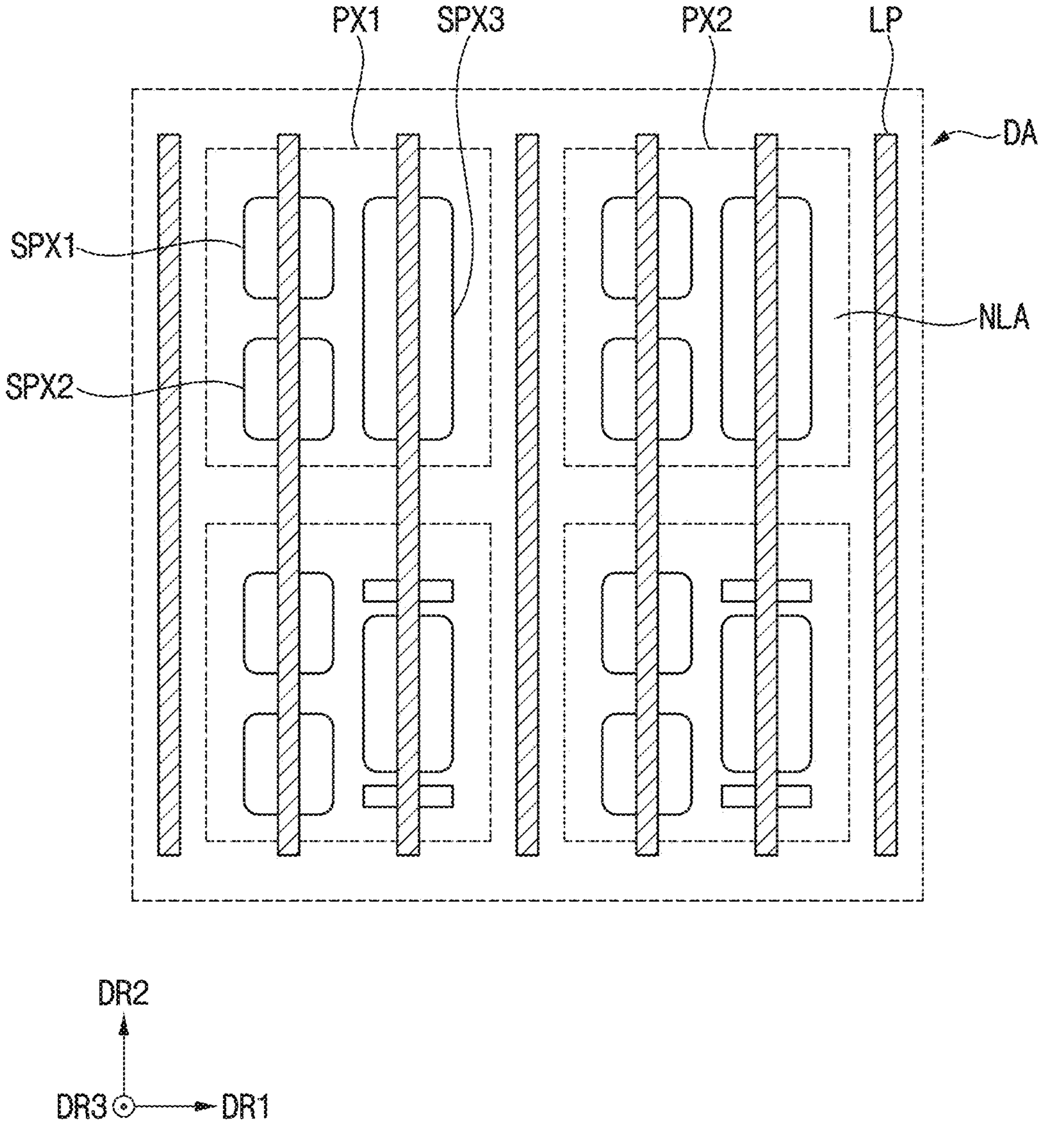
FIG. 18 is a plan view showing a display area on a display device according to an alternative embodiment.

FIG. 18 is a plan view magnifying a display area on a display device according to an alternative embodiment.

Referring to FIG. 18, a display device according to an alternative embodiment of the present disclosure may include a plurality of light blocking patterns LP. Hereinafter, any repetitive detailed description of the same or like elements as those of the display device DD described with reference to FIG. 2 will be omitted or simplified.

The plurality of light blocking patterns LP may be arranged side by side on a plane. Each of the plurality of light blocking patterns LP may extend in the second direction DR2. The plurality of light blocking patterns LP may be spaced apart from each other in a first direction DR1 crossing the second direction DR2. The plurality of light blocking patterns LP may be parallel to each other. In an embodiment, some of the plurality of light blocking patterns LP may overlap the first to third light emitting regions LA1, LA2, and LA3, and other parts of the plurality of light blocking patterns LP may overlap the non-light emitting area NLA.

Embodiments of the disclosure can be applied to various display devices such as display devices for vehicles, ships and aircraft, portable communication devices, display devices for exhibition or information transmission, medical display devices, or the like, for example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
- a substrate including a light emitting area and a non-light emitting area;
- a light emitting element disposed in the light emitting area on the substrate;
- an encapsulation layer disposed on the light emitting element;
- a transparent layer disposed on the encapsulation layer, wherein a plurality of first openings and a plurality of second openings are defined completely through the transparent layer when viewed in a thickness direction of the substrate;
- a plurality of light blocking patterns disposed on the encapsulation layer and filling the first openings, respectively;
- a first transparent pattern disposed on the encapsulation layer in each of the second openings; and
- a second transparent pattern disposed on the first transparent pattern,
- wherein the first transparent pattern has a refractive index greater than a refractive index of the transparent layer and a refractive index of the second transparent pattern, and
- wherein an upper surface of the first transparent pattern has a concave shape.

2. The display device of claim 1, wherein a recess is defined on an upper surface of the first transparent pattern, and the second transparent pattern fills the recess.

3. The display device of claim 1, wherein each of the transparent layer, the first transparent pattern, and the second transparent pattern include an organic material.

4. The display device of claim 1, wherein each of the light blocking patterns includes at least one selected from molybdenum-tantalum oxide and an organic material including a black pigment.

5. The display device of claim 1, wherein the transparent layer and the second transparent pattern include a same material as each other.

6. The display device of claim 1, wherein an angle between each of the light blocking patterns and the encapsulation layer is an acute angle or a right angle.

7. The display device of claim 1, wherein an angle between a boundary line where the transparent layer and the first transparent pattern are in contact with each other and the encapsulation layer is an acute angle or a right angle.

8. The display device of claim 1, wherein each of the light blocking patterns does not overlap the light emitting area, and overlaps the non-light emitting area.

9. The display device of claim 1, wherein a portion of the light blocking patterns does not overlap the light emitting area, and another portion of the light blocking patterns overlaps the non-light emitting area.

10. The display device of claim 9, wherein each of the light blocking patterns extends along to a second direction, and the light blocking patterns are spaced apart from each other along to a first direction crossing the second direction.

* * * * *